(12) United States Patent
Ferencz et al.

(10) Patent No.: US 6,914,508 B2
(45) Date of Patent: Jul. 5, 2005

(54) SIMPLIFIED TRANSFORMER DESIGN FOR A SWITCHING POWER SUPPLY

(75) Inventors: Andrew Ferencz, Southborough, MA (US); Gregory A. Zvonar, Winchester, MA (US); Bernhard Schroter, Upton, MA (US); Gerald Miller, Chelmsford, MA (US); William Ng, Leominister, MA (US)

(73) Assignee: Galaxy Power, Inc., Westborough, MA (US)

( * ) Notice: Subject to any disclaimer, the term of this patent is extended or adjusted under 35 U.S.C. 154(b) by 0 days.

(21) Appl. No.: 10/219,114

(22) Filed: Aug. 15, 2002

(65) Prior Publication Data

US 2004/0032313 A1 Feb. 19, 2004

(51) Int. Cl.[7] ................................................. H01F 5/00
(52) U.S. Cl. ....................... 336/200; 336/223; 336/232; 29/602.1
(58) Field of Search ........................... 336/200, 98, 198, 336/223, 232, 205, 192; 361/836; 29/602.1

(56) References Cited

U.S. PATENT DOCUMENTS 4,873,757 A * 10/1989 Williams .................. 29/602.1
6,420,953 B1 * 7/2002 Dadafshar .................. 336/200
6,466,454 B1 * 10/2002 Jitaru ......................... 361/836

* cited by examiner

Primary Examiner—Lincoln Donovan
Assistant Examiner—Jennifer A. Poker
(74) Attorney, Agent, or Firm—Cesari and McKenna, LLP

(57) ABSTRACT

A transformer has a primary winding made from a first conducting trace formed on a first multilayer printed circuit board, and a secondary winding made from a second conducting trace formed on a second multilayer printed circuit board. The primary winding is magnetically coupled to the secondary winding. The windings are etched as traces in copper layers of the PC boards as spirals. The spiral of one copper layer is connected to the spiral of a different copper layer by a via, or vias, formed through the insulating layer of the PC board. The vias are drilled, cleaned, and plated with conducting material, for example copper. By using multiple layers, and by connecting spiral windings of each layer to the windings of the next layer by use of vias, any number of turns can be built into a primary winding, or into a secondary winding.

30 Claims, 14 Drawing Sheets

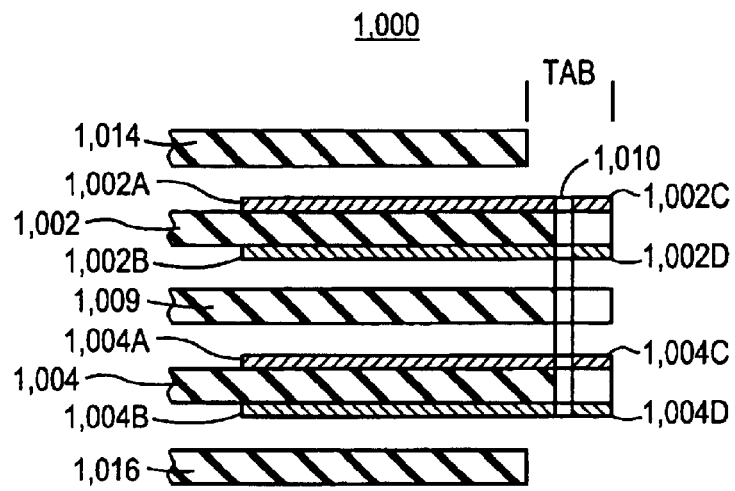
FIG. 10
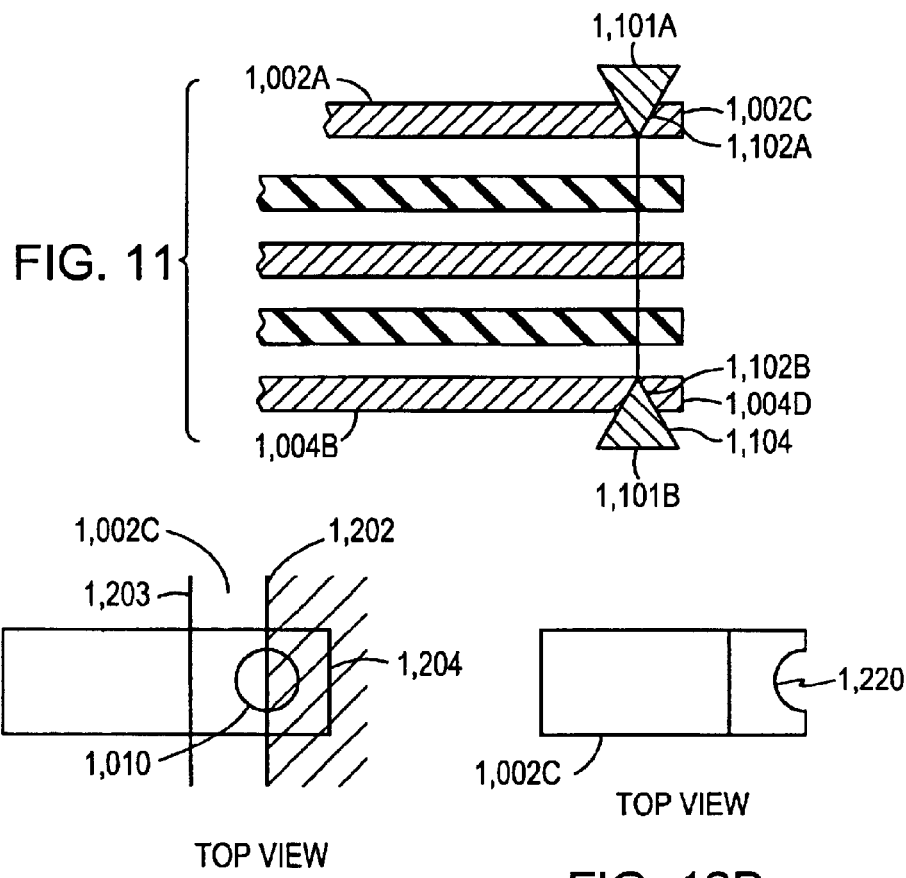
FIG. 11
FIG. 12A
FIG. 12B

SIMPLIFIED TRANSFORMER DESIGN FOR A SWITCHING POWER SUPPLY

BACKGROUND OF THE INVENTION

1. Field of the Invention

This invention relates to the field of electrical transformers, and more particularly to transformers for use on printed circuit boards.

2. Background Information

A transformer ordinarily consists of wire windings around a ferromagnetic core. The windings are usually a primary winding through which electrical current is directed, and secondary windings which are electrically isolated from the primary winding. A magnetic field generated by current flow in the primary winding couples to the secondary winding, and variations in the magnetic field induce current flow in the secondary windings. The ferromagnetic core provides a low reluctance path for the magnetic field.

When used with a printed circuit board (hereinafter PC board), the transformer must be mechanically mounted to the PC board, and must also have its windings electrically coupled to conductive tracings in the PC board.

The weight of the transformer presents a problem which the mechanical mounting must overcome. Also, construction of the transformer is expensive, as it must first be assembled from a variety of separate parts, and secondly it must be mounted on the PC board.

Additionally, the turns ratio in the transformer determines the operational characteristics of the transformer, and inventory of transformers must be maintained for various turns ratio. Further, when the PC board is manufactured by a supplier, and the PC board is held in inventory by a systems manufacturer, the systems manufacturer must hold PC boards for each desired turns ratio of the transformer in its inventory, as must the supplier.

When the PC board is a power supply, such as a DC to DC power converter, then the desired characteristics of the device employing the PC board are the input voltage and the output voltage. When several output voltages are required by the systems manufacturer, then usually power at a single input voltage is supplied to each of the different power supplies, and each power supply produces power at the desired output voltage. A systems manufacturer which requires a plurality of power supplies, each delivering power at a different voltage, must maintain in inventory PC boards with a transformer for supplying power at each required voltage. Also, the vendor of the power supplies must maintain in inventory complete PC boards containing the different transformers for supplying power at the different required output voltages.

The transformer may be the only part on the PC board which is different, from output voltage to output voltage, where the transformer determines the value of the output voltage of the power supply.

There is needed a better way to couple a transformer to a PC board so that manufacturing costs are reduced, and also so that the number of parts held in inventory by a manufacturer of power supplies is reduced.

SUMMARY OF THE INVENTION

The invention is a transformer having one winding, for example the secondary, built as tracings in a first multilayer PC board. The primary windings are made as a separate second PC board.

In an exemplary embodiment of the invention, the second PC board containing the primary windings is attached to the first PC board by attachment tabs built into the second PC board, and the tabs are soldered to receiving attachment pads of the first PC board.

In another exemplary embodiment of the invention, the first PC board has various other components mounted thereon. For example, the secondary windings of a power transformer along with the power supply circuits are all built into a first single PC board.

In another exemplary embodiment of the invention, the windings are etched as traces in copper layers of the PC boards as spirals. The spiral of one copper layer is connected to the spiral of a different copper layer by a via, or vias, formed through the insulating layer of the PC board. The vias are drilled, cleaned, and plated with conducting material, for example copper. By using multiple layers, and by connecting spiral windings of each layer to the windings of the next layer by use of vias, any number of turns can be built into a primary winding, or into a secondary winding. For example, connections to the ends of the windings are brought out to tabs. Taps on the windings, for example center taps, are formed by bringing desired locations in the etched spiral windings to connection tabs.

A ferromagnetic core, for example formed in an "E" configuration, is placed around the windings. In an exemplary embodiment of the invention, both the primary and the secondary windings are located in a single multilayer PC board, and the outer arms of the "E" configuration core fit around the single multilayer PC board, and the center arm of the "E" configuration pass through a hole at the center of the spiral windings.

In another exemplary embodiment of the invention, the ends of the "E" fit through slots at either side of the secondary winding traces in the power supply PC board, while the center arm of the "E" fits through a hole at the center of both the primary and secondary trace windings.

The windings built into the PC board having the power supply components mounted thereon are chosen to be the windings carrying the higher current. The windings carrying the higher current are then continuous traces in the PC board with traces leading to other components of the power supply. The winding carrying the higher current is often the secondary winding. Accordingly, the secondary windings are chosen to be in the PC board with the other components of the power supply. Currents are higher in the secondary circuits when the transformer is a step down transformer, which is the case when the input voltage level is greater than the output voltage level. For example, in many computer applications, the input voltage is in the 10 Volt range, and output voltages are in 1.0 to 4.0 Volt voltage range, with a different DC to DC converter power supply used to provide power at each desired output voltage.

In an exemplary embodiment of the invention, each of the desired DC to DC converter power supplies are built into one PC board, as contrasted with attaching a separate power supply board for each desired output voltage to a mother board. When a plurality of DC to DC converter power supplies are built into one board, each secondary is built as traces in the board, and the appropriate primary is attached by soldering in a position over the secondary traces so as to magnetically couple each primary winding to its corresponding secondary winding. A separate ferromagnetic core is placed around each transformer.

Other and further aspects of the present invention will become apparent during the course of the following description and by reference to the accompanying drawings.

BRIEF DESCRIPTION OF THE DRAWINGS

The invention description below refers to the accompanying drawings, of which:

FIG. 10 is a sectional view of an embodiment of the invention;

FIG. 11 is a side view of an embodiment of the invention;

FIG. 12A is a top view of an embodiment of the invention;

FIG. 12B is a top view of an embodiment of the invention;

DETAILED DESCRIPTION OF AN ILLUSTRATIVE EMBODIMENT

Figure 1:
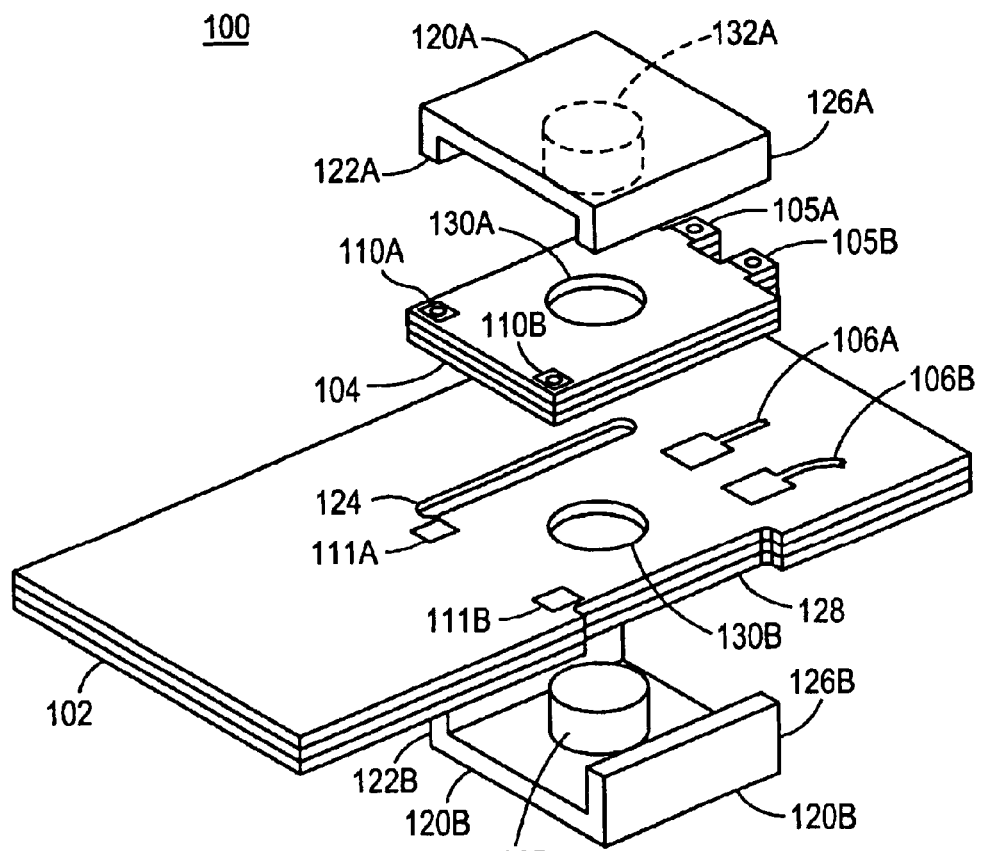
FIG. 1 is an isometric view of an embodiment of the invention.

Turning now to FIG. 1, assembly 100 shows the components of a transformer having secondary coils, not shown in FIG. 1, built into printed circuit board (PC board) 102. The primary coils (not shown in FIG. 1) are made in a small multilayer PC board 104. Electrical contacts to the primary coils are brought to connection tabs 105A, 105B. Small multilayer PC board 104 containing the primary coils is attached to PC board 102 by soldering electrical connection tab 105A to electrical connection pad 106A, and by soldering electrical connection tab 105B to electrical connection pad 106B. Copper point 110A and copper point 110B are electrically isolated from any traces within small PC board 104, and are soldered to copper point 111A and copper point 111B as shown, to assist in mechanical attachment of small PC board 104 to PC board 102.

The secondary coils of the transformer are within the PC board 102 adjacent to small PC board 104. Core 120A and core 120B are ferromagnetic half core pieces of "E" configuration, and fit around the primary coils in small PC board 104 containing the primary coils and the secondary coils built into PC board 102, in order to provide a low reluctance magnetic path for the magnetic field linking the primary and secondary coils. Arm 122A and arm 122B fit through slot 124, and arm 126A and arm 126B fit through notch 128. Central core 132A (shown as dashed hidden lines) and central core 132B fit through central hole 130A in small PC board 104 and hole 130B in PC board 102. Central core 132A 132B fit through the center of the primary winding in small PC board 104 and through the center of the secondary winding in PC board 102. The ends of core arms 122A, 122B, arms 126A, 126B, and central core 132A, 132B are fastened together by adhesive to form an "E" shaped magnetic circuit for the magnetic field linking the primary winding and the secondary winding. The adhesive may be epoxy, glue, or other convenient adhesive.

Figure 2:
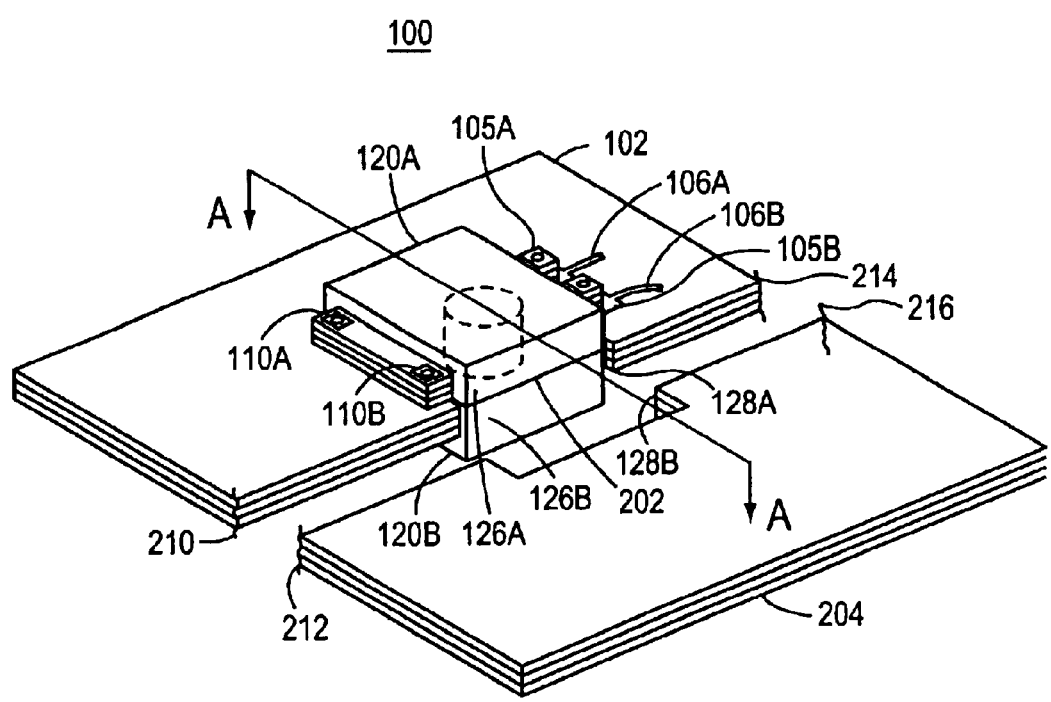
FIG. 2 is an isometric view of an embodiment of the invention.

Turning now to FIG. 2, assembly 100 is shown assembled. Tab 105A is soldered to connection pad 106A. Tab 105B is soldered to connection pad 106B. Copper point A 110A is soldered to copper point 111A (not shown in FIG. 2). Copper point 110B is soldered to copper point 111B (not shown in FIG. 2). The two core pieces 120A 120B are is shown joined, where line 202 represents an adhesive line between the two core pieces 120A 120B.

PC board 204 represents an optional continuation of PC board 102. In the event that optional extension PC board 204 is present, notch 128A and notch 128B form a slot for arms 126A and 126B of the core 120A 120B. In the event that the transformer is mounted at the edge of PC board 102, notch 128 simply provides a convenient passage for the arms 126A and 126B of the core 120A 120B. Wavy lines 210, 212, 214, 216 indicate that PC board 204 is optional, and that the transformer may be either mounted in a PC board (PC board 204 present) or may be edge mounted on PC board 102.

Figure 3:
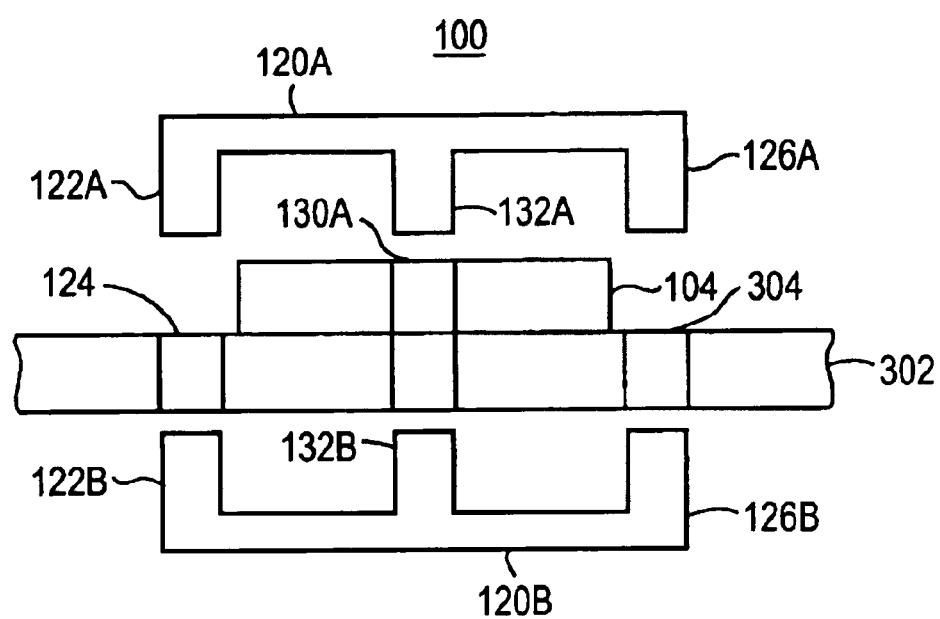
FIG. 3 is a cross sectional view of an embodiment of the invention.

Turning now to FIG. 3, a cross section of assembly 100 is shown along section AA as shown in FIG. 2. Ferromagnetic core 120A 120B is shown disassembled. Small PC board 104 containing the primary winding is shown in place on PC board 302, where PC board 302 contains the secondary winding. PC board 302 is both PC board 102 and PC board 204, so that notch 128 and notch 206 are shown as slot 304. Arm 122A and arm 122 B fit into slot 124, and arm 126A and arm 126B fit into slot 304. Core 120A and core 120B are fastened together by an adhesive to form a single ferromagnetic core. Such a single ferromagnetic core is shown joined along adhesive line 202 in FIG. 2.

Figure 4:
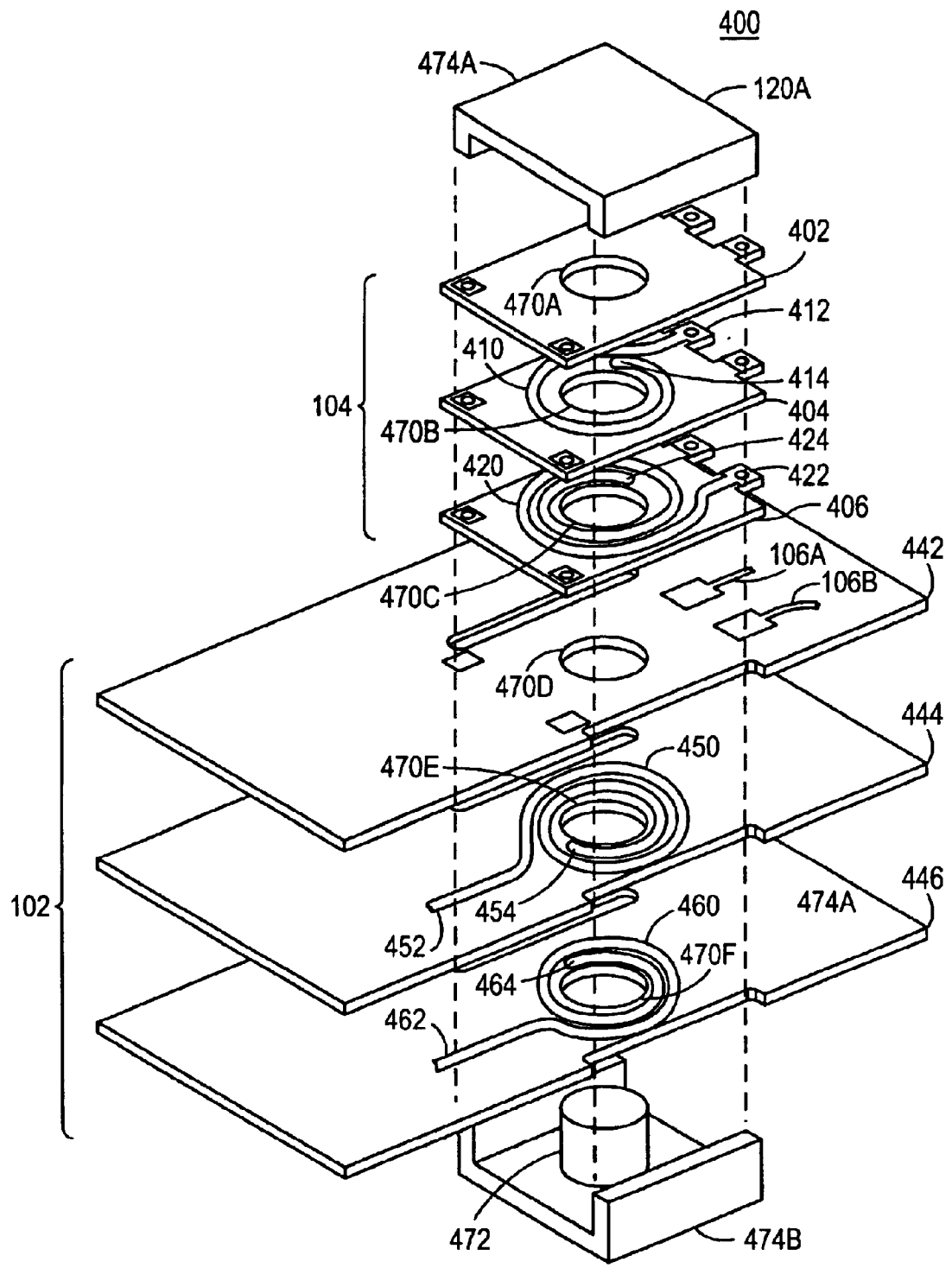
FIG. 4 is an exploded isometric view of an embodiment of the invention.

Turning now to FIG. 4, assembly 400 is shown as an exemplary embodiment of the invention in an exploded view so that the exemplary primary and secondary coils are visible as traces in a multilayer PC board. As shown in exemplary embodiment 400, multilayer small PC board 104 is made up of three PC boards, PC board 402, PC board 404, and PC board 406. Board 402 has a spiral copper trace 410 connected at a first end to electrical connection tab 412, and a second end 414 at the interior of the spiral. Board 406 has a spiral copper trace 420 connected at a first end to electrical connection tab 422, and a second end 424 interior to the spiral. End 414 of spiral trace 410 is "above" end 424 of spiral trace 420. End 414 is electrically joined to end 424 by an electrically conducting via (not shown in FIG. 4) through PC board 404. The electrically conducting via through PC board 404 can be formed by first bonding together PC boards 404, 406 to form a single multilayer PC board. A hole is then drilled so that it is perpendicular to both PC boards 404 406, and the hole passes through both end 414 and end 424. The hole is then cleaned and plated with conducting material, typically the conducting material is copper. The plated copper then forms an electrical connection between end 414 and end 424.

With an electrical connection between end 414 and end 424, an electrical circuit is formed, beginning at tab 412 along spiral 410 to end 414, through the conducting via to end 424 and then along spiral 420 to tab 422. Spiral 410 and spiral 420 then form a single coil with end connections at tab 412 and tab 422. The single coil formed by spiral 410 and spiral 412 is used as the primary of the transformer.

PC board 402 is then joined to the assembly of PC boards 404 406 in order to provide an insulating layer to protect conducting spiral trace 410, and the upper end of the conducting via connecting end 414 to end 424. The insulating layer provided by PC board 402 protects spiral copper trace 410 from electrically shorting against core 120A when the transformer is finally assembled.

Multilayer PC board 102 is formed, in the exemplary embodiment of the invention shown as assembly 400, from PC board 442, PC board 444, and PC board 446.

PC board 442 forms the surface of multilayer PC board 102, and has connection pad 106A for electrical connection to primary winding connection tab 412, and also has connection pad 106B for electrical connection to primary winding connection tab 422.

Spiral trace 450 has a first end 452 which serves as an electrical connection to other traces (not shown) in PC board 444, and has a second end 454 at the interior of spiral trace 450. Spiral trace 460 has a first end 462 which serves as an electrical connection to other traces (not shown) in PC board 446, and has a second end 464 at the interior of spiral trace 450. An electrical conducting via (not shown in FIG. 4) through PC board 444 connects end 454 with end 464.

With an electrical connection between end 454 and end 464, a complete electrical circuit is formed from end 452 of spiral electrically conducting trace 450 to end 454, through the electrically conducting via (not shown) in PC board 444 to end 464, and then along spiral electrically conducting trace 460 to end 462. This complete electrical circuit is used as the secondary of a transformer in the exemplary embodiment of the invention shown in assembly 400.

The transformer, consisting of primary coils formed from spiral electrically conducting traces 410 420, and secondary coils formed from spiral electrically conducting traces 450 460, has a single primary coil and a single secondary coil. Alternative embodiments of the invention, described below, have conducting traces on PC boards in both center tapped primary windings and in center taped secondary windings. Further, taps at any desired location in the coils may be made in similar fashion using spiral coils made by etching away copper of a PC board, and connecting spiral coils on different PC board layers by use of electrically conducting vias.

Further, transformers may be made with any desired number of turns by using more, or fewer, layers of PC boards. For example, a PC board having copper cladding on both sides may have spiral trace coils such as spiral traces 410 and 420 made with spiral trace 410 on a first side and spiral trace 420 on a second side, and the two traces joined at s interior ends by an electrically conducting through via. A second PC board having traces on each side may then be bonded to the first PC board, with an insulating layer between the two PC boards having the electrically conducting traces. The traces on the two PC boards are then joined at appropriate ends by another through via to form a single coil having four layers of spiral electrical conducting traces. In similar manner, coils having any desired number of turns may be built up using PC board construction. An electrical insulating layer is then bonded to the multilayer assembly on both the "top" and "bottom" to electrically protect the traces. The "through" vias made during assembly of the various PC boards then become "blind" vias or "buried" vias as they are blocked by the two outer insulating layers, as will be described in greater detail hereinbelow.

As a practical matter, when ends of traces are joined, such as end 414 joined to end 424, and also end 454 joined to end 464, several vias may be drilled, cleaned, and plated in order to reduce the electrical resistance of the via connection. Also, using several drill holes, and so several vias, provides reliable backup in case one of the vias does not properly plate with copper during the via plating operation.

Hole 470A, 470B, 470C, 470C, 470D, 470E, 470F, etc. shown in FIG. 4, accepts the center arm 472 of "E" shaped ferromagnetic core 474A, 474B, or for example central core 132A, 132B, etc.

Although as shown in FIG. 4 there are two spiral conducting traces 410, 420 used to form the primary winding, it is to be understood that any number of layers may be employed to make as many turns to the primary winding as is desired. Additional layers (not shown in FIG. 4) may be added to the multilayer PC board structure 104, and the layers may be electrically connected by electrically conducting vias, to form as many turns in the primary winding as is desired by the designer.

Further, even though as shown in FIG. 4 there are two spiral conducting traces 450, 460 used to form the secondary winding, it is to be understood that any number of layers may be employed to make as many turns to the secondary winding as is desired. Additional layers (not shown in FIG. 4) may be added to the multilayer PC board structure 102, and the layers may be electrically connected by electrically conducting vias, to form as many turns in the secondary winding as is desired by the designer.

Figure 5:
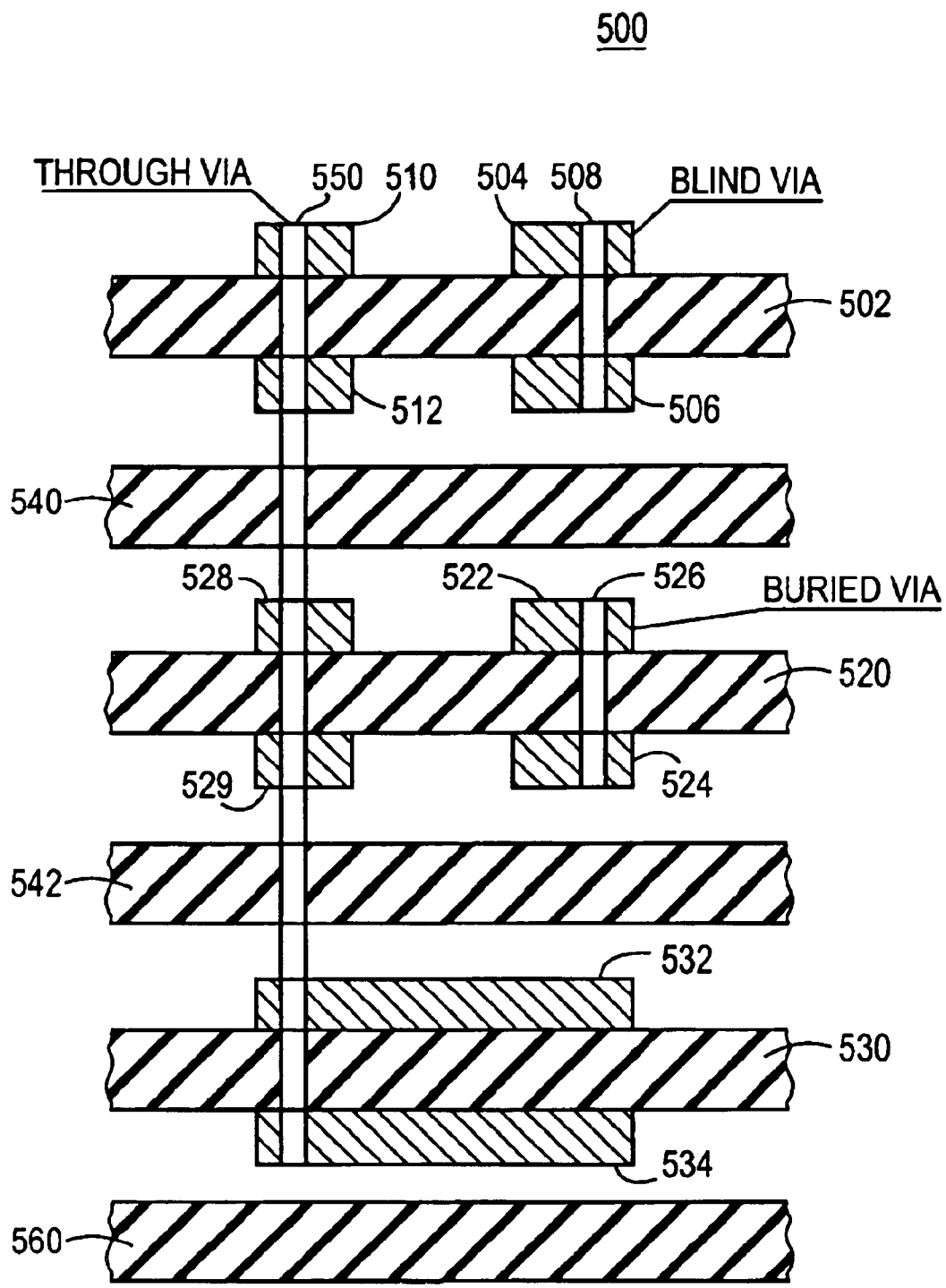
FIG. 5 is a cross sectional view of an embodiment of the invention.

Turning now to FIG. 5, assembly 500 represents a multilayer PC board assembly of the type which may be used to build up either primary coils or secondary coils for a transformer. The steps used to build up the multilayer assembly 500, along with making the electrically conducting vias, is described.

PC board 502 has conducting trace 504 on a first side and conducting trace 506 on a second side. After the traces are etched to form the desired geometry on the surfaces of the board 502, via 508 is formed by drilling a hole through the PC board 502 to form a via 508, and the via is electroplated with copper, or some other electrical conducting material, to form an electrical connection between trace 504 and trace 506. Board 502 also has trace 510 on its first surface, and trace 512 on its second surface. At this point in assembly, no hole is drilled in PC board 502 through traces 510 512.

PC board 520 has electrically conducting trace 522 on a first surface and electrically conducting trace 524 on a second side. Again, an electrically conducting via 526 forms an electrical connection between trace 522 and trace 524.

PC board 530 has electrical conducting trace 532 on a first side and electrical conducting trace 534 on a second side.

After PC boards 502, 520, 530 are made, they are assembled along with insulating layers 540 542 into a multilayer assembly. Heat and pressure, and adhesive if desired, are then used to bond the layers 502, 520, 530, 540, 542 into a single multilayer assembly. The adhesive may be epoxy, glue, or other adhesive as desired. A hole for via 550 is then drilled through the assembly, and then the hole cleaned. Conducting material, such as copper, is then electroplated into the hole to form the via 550, and via 550 provides electrical connection between the electrical conducting traces penetrated by the hole. For example, via 550 provides electrical connection between electrical conducting traces 510 512 of PC board 502, traces 528 529 of PC board 520, and traces 532 534 of PC board 530.

As shown in exemplary embodiment 500, a final assembly construction step of bonding an insulating layer 560 to the "bottom" (bottom as drawn) of the assembly is performed. Traces 510 and 504 are left exposed on the "top" surface of the assembly 500. Alternatively, no insulating layer 560 need be bonded to the assembly, leaving trace 534 exposed. As a further alternative, an insulating layer (not shown) could be bonded "above" traces 510 504 in order to electrically insulate them from the environment.

Manufacture of multilayer PC Boards is shown in the book edited by Clyde F. Coombs, Jr. entitled *Printed Circuit Handbook, Fourth Edition*, published by McGraw Hill, New York, Copyright date 1996, all disclosures of which are incorporated herein by reference, particularly at pages 22.13–22.14, 23.2–23.3, 23.7.

Turning now to FIG. 6A–FIG. 6E, there is shown construction of a center tapped coil which may be used for either a primary winding or a secondary winding of a transformer. Layer 602 has an electrically conducting spiral trace 604.

Trace 604 begins at connection end 606 and follows a spiral geometry to inner end 608.

Layer 610 has a spiral trace 611 which begins at connection end 612 and follows a spiral geometry to inner end 614.

Figure 6A:
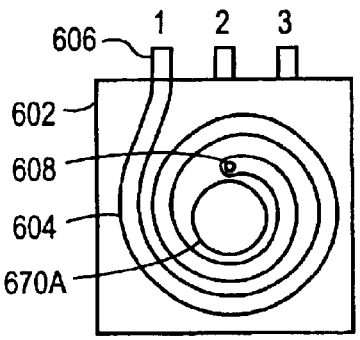
FIG. 6A–FIG. 6D are top views of an embodiment of the invention.
Figure 6B:
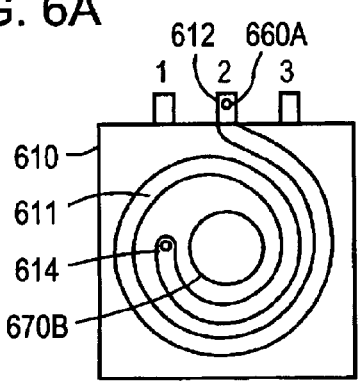
Figure 6C:
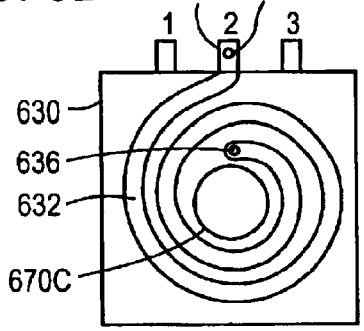
Figure 6D:
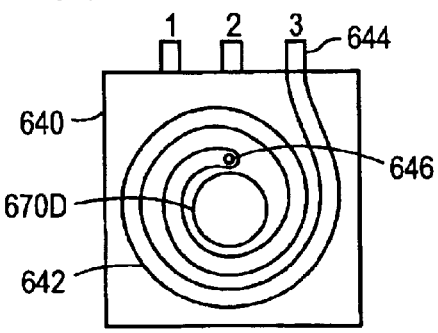
Figure 6E:
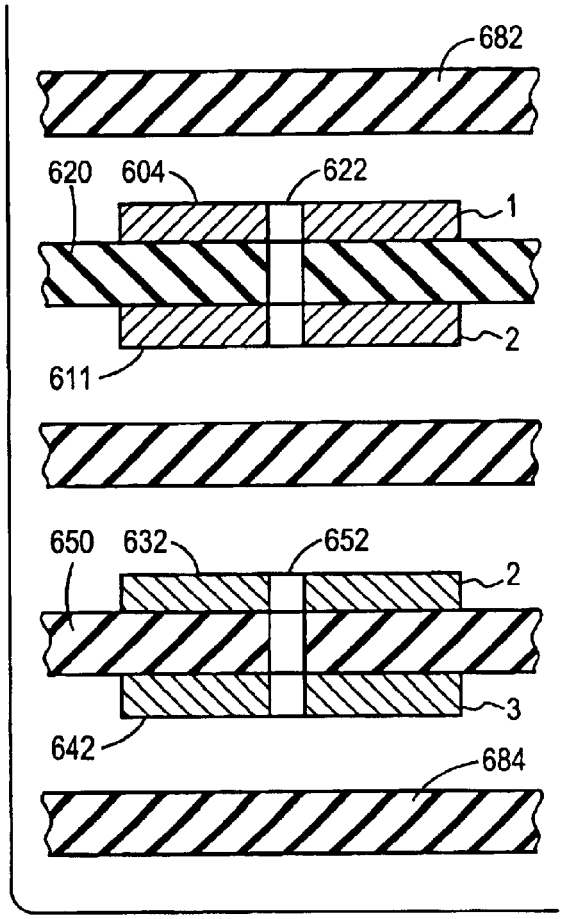
FIG. 6E is a cross sectional view of an embodiment of the invention.

Layer 602 may, for example, be etched on one side of a double layer PC board, and layer 614 may be etched on the other side of the double layer PC board. For example, FIG. 6E shows electrically conducting trace 604 on a first side of double sided PC board 620, and shows electrically conducting trace 611 on a second side of double sided PC board 620. Via 622 electrically joins trace 604 at end 608 with trace 611 at end 614. A complete electrical circuit, forming a multi-turn coil, is formed by following trace 604 from end 606 around the turns of the spiral to end 608, through via 622 to end 614 of trace 611, and around the spiral of trace 611 to connection end 612. Trace 611 is made as a mirror of trace 604 so that together they form a continuous coil similar to a solenoid winding.

Layer 630 has spiral trace 632 which has a connection end 634, and continues through a spiral geometry to inner end 636.

Layer 640 has a spiral trace 642 with a connection end 644, and a spiral geometry to inner end 646.

Again, layer 640 may be etched on one side of a double layer PC board 650 and layer 642 etched on the other side of the double layer PC board 650. As shown in FIG. 6E, trace 632 is shown on one side of PC board 650, and trace 642 is shown on the other side of PC board 650. Via 652 electrically connects trace 632 at inner end 636 to inner end 646 of trace 642. Accordingly, a complete electric circuit is traced from connection end 634 around spiral tracing 632 to inner end 636, through electrically conducting via 652 to inner end 646 of trace 642, and then around the spiral geometry of trace 642 to connection end 644.

To make a center tapped winding, connection end 612 is electrically connected to connection end 634. For example, hole 660A shown in connection end 612 and hole 660B shown in connection end 634 may form an electrically conducting via which electrically connects connection end 612 to connection end 634. The electrically conducting via formed by hole 660A and hole 660B may be electroplated on the inside with a conducting material such as copper in order to make the electrical connection between trace 611 and trace 632.

The spiral geometry is formed so that a center tapped solenoidal coil is formed, as shown by tracing all four spirals 604, 611, 632, 642: first, starting at connection end 606 around spiral trace 604, through connection via 622, and then around spiral 611 to connection end 612; second, through the electrically conducting via formed from holes 660A, 660B from connection end 612 to connection end 634, to electrically connect end 612 and end 634; and third, from connection end 634 around spiral 632 to inner end 636, through via 652 to inner end 646, and then around spiral 642 to connection end 644. The center tapped solenoidal coil may be used as a primary coil of a transformer, or alternatively, the center tapped coil may be used as the secondary coil of a transformer.

Hole 670A, 670B, 670C, 670D represents a hole through the center of the winding such as hole 130A 130B of FIG. 1 and FIG. 2, or hole 470A, 470B, 470C, 470D, 470E, 470F, etc. as shown in FIG. 4, where the hole accepts the center arm of an "E" shaped ferromagnetic core.

Figure 7:
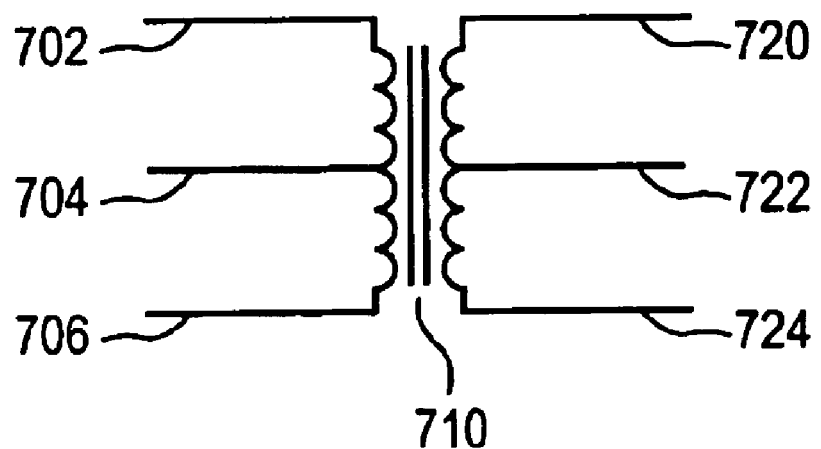
FIG. 7 is an electrical diagram of a transformer.

Turning now to FIG. 7, there is shown an electrical representation 700 of a transformer. A center tapped primary coil having first end connection 702, center tap 704, and second end connection 706 is shown. The ferromagnetic core is represented by lines 710.

A center tapped secondary coil having first end connection 720, center tap 722, and second end connection 724 is shown.

The coil of FIG. 6A–FIG. 6F may be used to construct a center tapped primary, where end connection 702 is represented by end connection 606, center tap connection 704 is represented by end connections 612 and 634, along with connection via made from holes 660A and 660B, and finally where end connection 706 is represented by end connection 644.

Alternatively, the coil of FIG. 6A–FIG. 6F may represent the center tapped secondary coil of transformer 700. In this case, end connection 720 is represented by end connection 606, center tap connection 722 is represented by end connections 612 and 634, along with connection via made from holes 660A and 660B, and finally end connection 724 is represented by end connection 644.

In the alternative embodiment wherein the coil represented by FIG. 6A–FIG. 6E is made in the small PC board, such as small PC board 104, the connection ends, that is connection end 606, and connection end 612, and also connection end 644 are connection tabs such as connection tabs 105A and 105B.

In the alternative embodiment wherein the coil represented by FIG. 6A–FIG. 6E is built into a large PC board such as PC board 102, then the connection ends, that is connection end 606, connection ends 612 634, and also connection end 644 are connection ends such as connection end 452 and connection end 462 as shown in FIG. 4, and the connection ends 452 462 are co-extensive with further conductive traces (not shown) in the large PC board 1022.

Figure 8A:
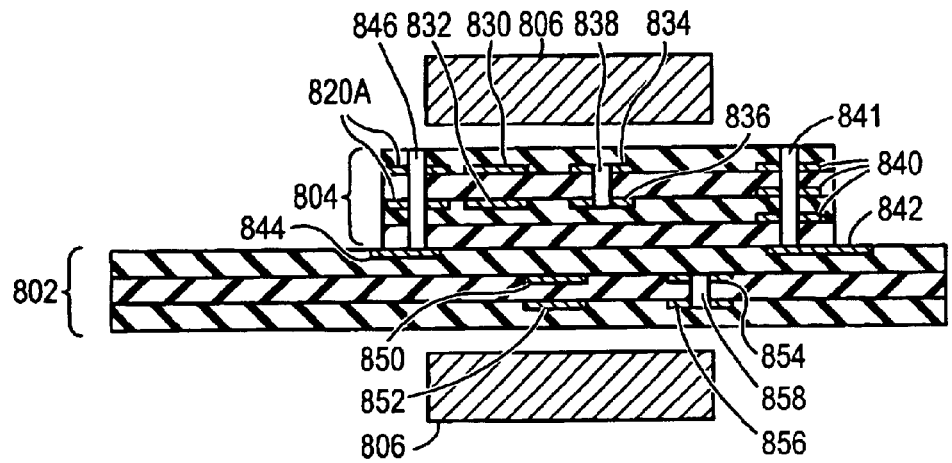
FIG. 8A is a sectional view taken along section AA of FIG. 8.
Figure 8:
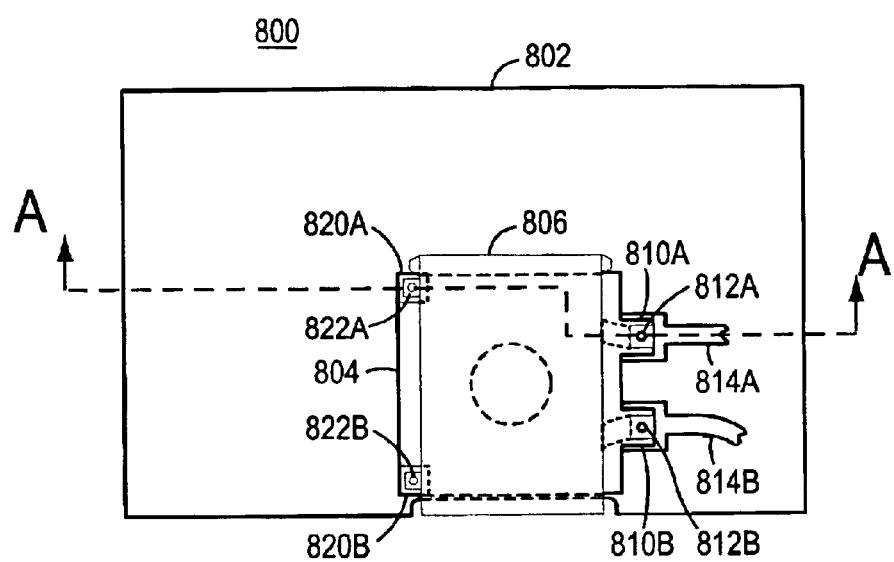
FIG. 8 is a top view of an embodiment of the invention.

Turning now to FIG. 8, there is shown assembly 800. Assembly 800 has a large PC board 802 having a transformer primary 804 mounted thereon. Transformer primary 804 is made as a small multilayer PC board as PC board 104, and as shown in FIG. 6A–FIG. 6B. Ferromagnetic core 806 surrounds the transformer windings in both the primary coils in primary 804 and the secondary windings (not shown in FIG. 8) which are in the large PC board 802.

Connection tab 810A, of different layers of small multilayer PC board 806, has an electrically conducting via 812A electrically connecting the connection tabs of the different layers of transformer primary 804. Connection tabs 810A are soldered to connection pads 814A of large PC board 802.

Connection tabs 810B of different layers of small multilayer PC board 806, are electrically connected by electrically conducting via 812B. Connection tabs 810B are soldered to connection pad 814B.

Mechanical support tabs 820A and 820B are soldered to electrically isolated traces on large PC board 802 in order to supply mechanical attachment between primary 804 and large PC board 802. Hole 822A in support tab 820A, and hole 822B in support tab 820B, form metallic contact to electrically isolated traces in the multilayer PC boards making up primary 804, and facilitate soldering the electrically isolated traces in primary 804 to the electrically isolated traces in multilayer PC board 802. Soldering electrically isolated point 820A, representing all layers of multilayer PC board 806, to electrically isolated point 844 (FIG. 8A) improves the mechanical connection of primary multilayer PC board 804 to the large PC board 802. Section AA is illustrated in FIG. 8A.

Turning now to FIG. 8A, traces 830, 832, 834, 836 forming parts of the primary spiral coil are shown. Trace 830 and trace 832 are electrically isolated, as shown in FIG. 8A. Trace 834 is electrically connected to trace 836 by electrically conducting via 838.

Connection tabs 840 connect to spiral tracings forming coils of the primary 804. Connection tabs 840 are electrically connected by electrically conducting via 841. Connection tabs 840 are soldered to connection pads 842 to provide both electrical and mechanical connection between the primary 804. Further, mechanical connection is made by soldering electrically isolated mechanical support tab 820A to mounting metallic, but electrically isolated, pad 844. Via 846 is internally electroplated in order to form mechanical attachment between various layers of the multilayer construction of primary multilayer PC board 804.

Large PC board 802 is shown as a multilayer construction. Traces 850, 852, 854, 856 are parts of the secondary winding of the transformer within large PC board 802. Traces 854, 856 are connected by electrically conducting via 858. The secondary end connections, and center tap if one is employed, are brought out to further traces in the corresponding layers of the multilayer PC board 802, as shown in FIG. 4 by connection ends 452, 462.

Figure 9:
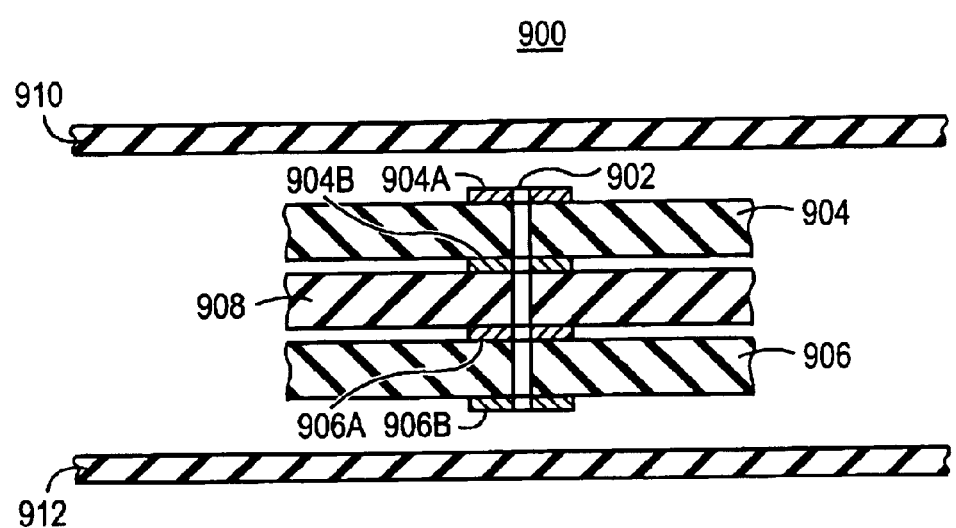
FIG. 9 is a sectional view of an embodiment of the invention.

Turning now to FIG. 9, multilayer PC board 900 is shown. FIG. 9 illustrates a conducting via 902 made through two double sided PC boards 904 906 separated by an insulating PC board layer 908. PC board 904 has conducting layer 904A, usually copper, on one side, and conducting layer 904B on the other side. PC board 906 has conducting layer 906A on one side, and conducting layer 906B on the other side. Insulating layer 908 electrically separates conducting layer 904B from conducting layer 906B. Electrically conducting via 902 electrically connects traces 904A, 904B, 906A, and 906B. In an exemplary embodiment of the invention, copper is electroplated within a drill hole to form electrically conducting via 902.

In a desired embodiment of the invention, insulating layer 910 and insulating layer 912 may be used as desired, to electrically protect either conducting layer 904A or conducting layer 906B from the environment. Accordingly, insulating layer 910 and insulating layer 912 are shown separated from the other layers, as layers 910 912 are optional, depending upon the particular design.

All layers used, for example, layers 910, 904, 908, 906, 912 are made into a multilayer PC board by applying heat and pressure to the assembly, and when desired, by applying an adhesive between the layers.

Turning now to FIG. 10, FIG. 11, FIG. 12A, and FIG. 12B there is illustrated an alternative method of attaching a small multilayer PC board such as small PC board 104 to a large PC board. FIG. 10 illustrates a small multilayer PC board 1,000. Layer 1,002 and layer 1,004 are double layer PC boards. Layer 1,002 has conducting layer 1,002A on a first side and conducting layer 1,002B on a second side. Conducting layer 1,002A is brought out to connection tab 1,002C. Conducting layer 1,002B is brought out to connection tab 1,002D.

Layer 1,004 has conducting layer 1,004A on a first side, and conducting layer 1,004B on a second side. Conducting layer 1,004A is brought out to connection tab 1,004C, and conducting layer 1004B is brought out to connection tab 1,004D.

Layer 1,009 is an insulating layer used to electrically separate trace 1,002B from trace 1,004A. Layer 1,014 is an optional layer which may be used to protect trace 1,002A from the environment. Layer 1,016 is an optional layer which may be used to protect trace 1,004B from the environment.

Hole 1,010 is drilled through the connection tabs 1,002C, 1,002D, and 1,004C, 1004D, and any insulating layers between the metallic layers.

Next, a scoring tool 1,101A is used to score through the outer layer of copper 1,002C, along a diameter of hole 1,010, where the diameter is in a line 1,202 parallel to the edge 1,203 of the multilayer PC board 1,000. The scoring tool makes a "V" grove 1,102A along line 1,202 through the top conducting tab 1,002C. Also the scoring tool 1,101B is used to make a "V" grove 1,102B through the bottom conducting tab 1,004D along a line hidden below, and parallel to, line 1,202.

Turning now to FIG. 12A, connection tab 1,002C with the V grove represented by line 1,202 is shown. The connection tabs are then cut along line 1,202, so that portion 1,204 is cut away and discarded.

Turning now to FIG. 12B, a top view is shown of connection tab 1,002C, which is above tab 1,002D, 1,004C, 1,004D which are hidden below connection tab 1,002C. Each connection tab is now a semicircle 1,220, formed from an inner surface of hole 1,010 after portion 1,204 is cut away and discarded.

A problem in cutting connection tabs 1,002C, 1,002D, 1,004C, and 1,004D is that burs and jagged portions of copper are produced on the outside copper conducting layers, such as presented at connection tabs 1,002C and 1,004D. Forming the "V" grove in the exposed copper prevents formation of metallic burrs when the cutting step of FIG. 12A is performed.

Accordingly, FIG. 12B illustrates a top view of a cleanly cut stack of connection tabs 1,002C, 1,002D, 1,004C, 1,004D, etc. having as semicircular exposed surface 1,220.

Figure 13:
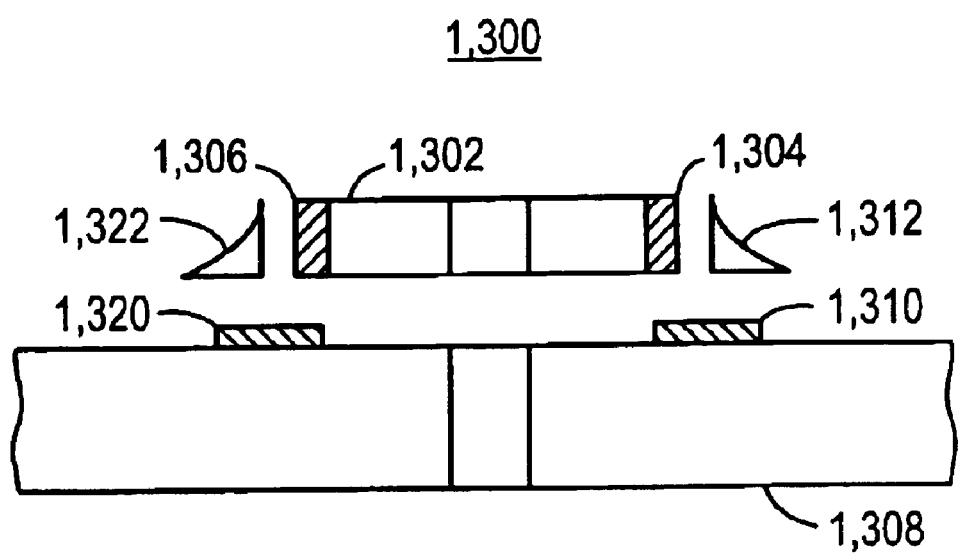
FIG. 13 is a sectional view of an embodiment of the invention.

Turning now to FIG. 13, there is illustrated assembly 1,300. A small multilayer PC board 1,302 with traces brought out to connection tabs 1,304 and connection tabs 1,306 is shown. Small multilayer PC board 1,302 is attached to large multilayer PC board 1,308 by soldering.

Connection tabs 1,304, and connection tabs 1,306 both represent a stack of connection tabs as illustrated by connection tabs 1,002C, 1,002D, 1,004C, and 1,004D, etc. in FIG. 10 and FIG. 12B, after the stack of connection tabs has been cut along line 1,202 to form the top view as illustrated in FIG. 12B. That is, concave half round metal is exposed along the exposed semicircular edge 1,220 of the connection tabs. The small multilayer PC board is attached to metallic attachment pads, for example, connection tabs 1,304 are attached to copper trace 1,310 by solder 1,312. Likewise, connection tabs 1,306 are attached to copper trace 1,320 by solder 1,322. As illustrated in FIG. 13, small multilayer PC board 1,302 is surface mounted on large PC board 1,308.

The soldering of the concave stack of connection tabs by exposed semicircular surfaces 1,220 to attachment pads on the large PC board 1,308 improves the ease by which a small multilayer PC board may be attached to a large PC board, where the attachment makes both electrical and mechanical connection between the small multilayer PC board and the large PC board.

The soldering of the concave half round geometry of the connection tabs 1,002C, 1,002D, 1,004C, and 1,004D is facilitated by first plating the exposed metal tracings on semicircular surfaces 1,220, with a metallic conductor, for example by plating with copper. The copper plated exposed ends of the connection tabs 1,002C, 1,002D, 1,004C, and 1,004D are easy to solder, and plating by, for example, copper, greatly facilitates a solid electrical connection to connection pads 1,310, etc.

Similarly, connection tabs 1,306 are half round exposed traces of conducting material, for example copper, as illustrated in FIG. 12B, and these connection tabs are correspondingly plated by conductive material, for example copper. The plated connection tabs 1,306 then may be easily soldered by solder 1,332 to connection pad 1,320.

Figure 14:
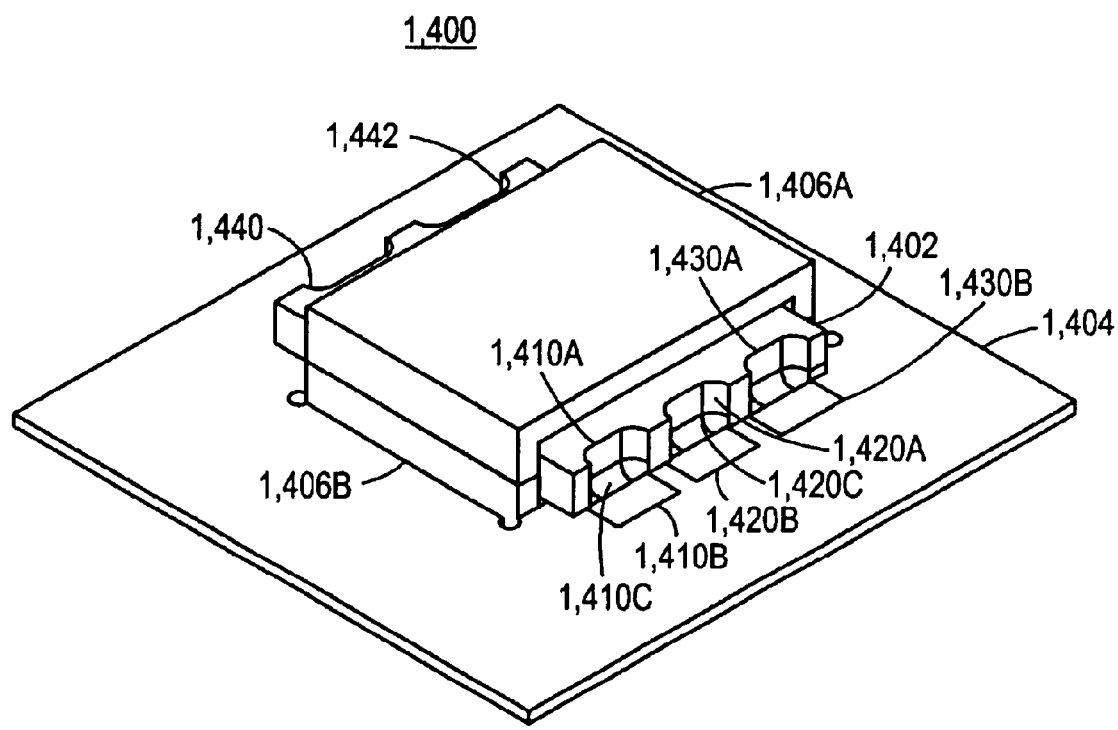
FIG. 14 is an isometric view of an embodiment of the invention.

Turning now to FIG. 14, assembly 1,400 is shown. Assembly 1,400 has a small multilayer PC board 1,402 which is both electrically and mechanically attached to a large PC board 1,404. A ferromagnetic core made up of ferromagnetic core 1,406A and 1,406B surrounds small multilayer PC board 1,402 in order to provide a low reluctance path for the magnetic field. Exposed concave half round connection tabs 1,410A are plated by a conductive material, for example copper. Further, exposed concave half round is connection tabs 1,410A are soldered by solder 1,40C to connection pads 1,410B. Solder 1,410C provides both electrical and mechanical connection of small, multilayer PC board 1,402 to large multilayer PC board 1,404.

Likewise connection tabs 1,420A are connected to connection pads 1,420B by solder 1,420C. Further, a plurality of connection tabs may be individually soldered to respective connection pads to electrically connect coils formed in the layers of the small multilayer PC board to conductive traces within the large PC board. For example, connection tabs 1,410A, 1,420A, 1,430A may be connections to a center tapped coil, as illustrated in FIG. 6A–FIG. 6E. As a further example, connection tabs 1,440 and connection tabs 1442 may be end connections to a single coil as illustrated in FIG. 4.

As an exemplary embodiment of the invention, small multilayer PC board 1,402 may contain an entire transformer, with connection tabs 1,440 and connection tabs 1,442 providing end connections to a primary winding, and connection tabs 1,410A, 1,420A, and 1,430A providing a connections to a center tapped secondary coil.

In a further alternative embodiment of the invention, small multilayer PC board 1,402 may contain only primary windings, either a single coil or a center tapped coil, to magnetically couple with secondary coils made into the large PC board 1,404.

Figure 15:
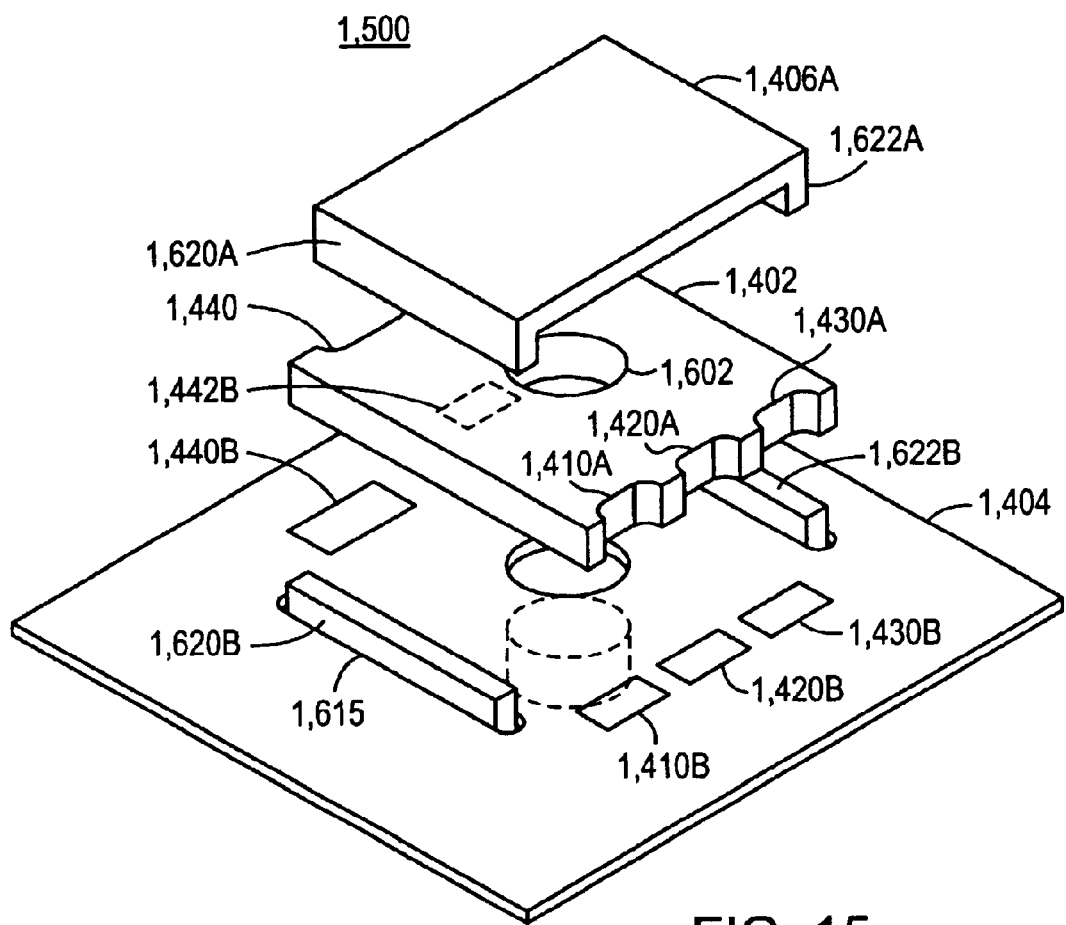
FIG. 15 is an isometric view of an embodiment of the invention.

Turning now to FIG. 15, an assembly drawing 1,500 of assembly 1,400 is shown. The two sections of ferromagnetic core 1,406A and 1,406B are shown, along with hole 1,602 in small multilayer PC board 1,402 to accept the center "E" arm of the ferromagnetic core 1,406A, 1,406B.

Figure 16:
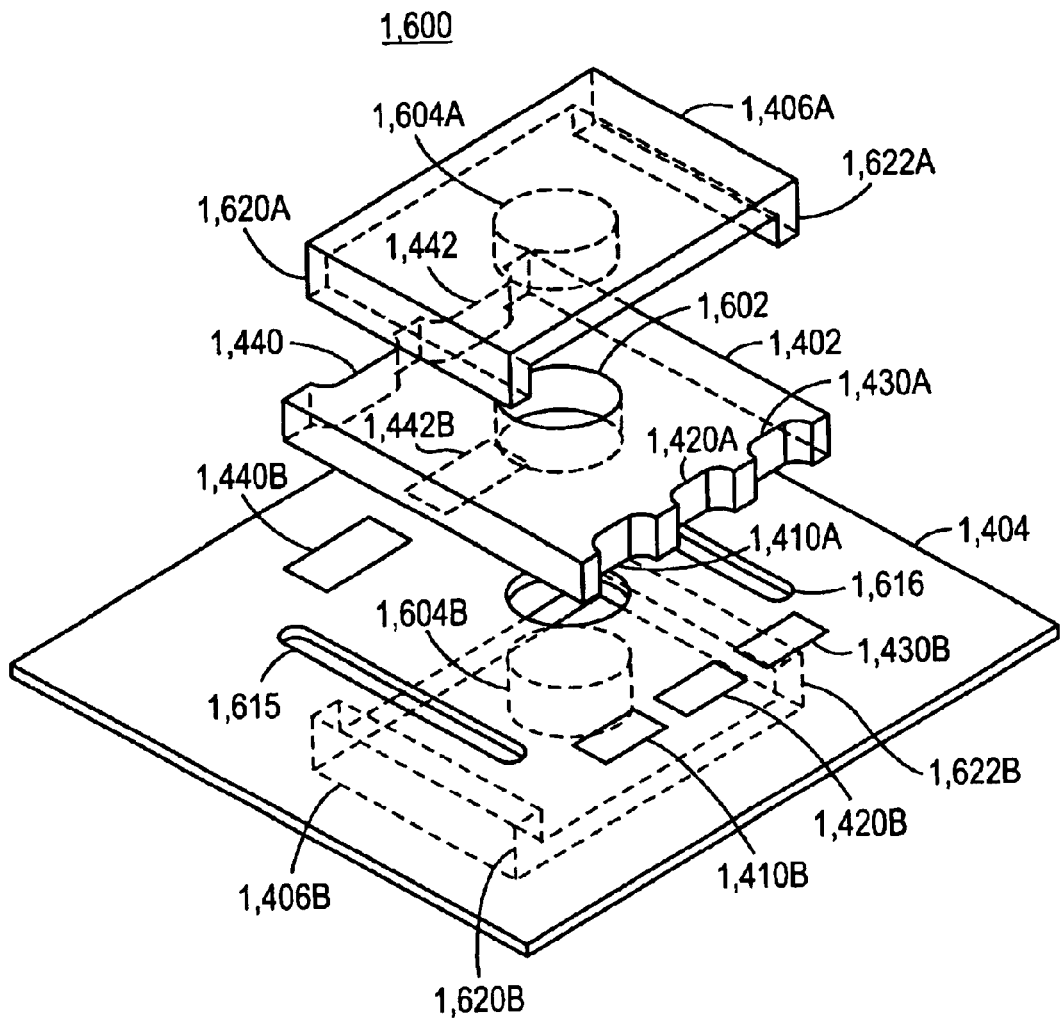
FIG. 16 is an isometric view of an embodiment of the invention.

Turning now to FIG. 16, a further assembly drawing of assembly 1,400 is shown. Connection pad 1,440B is shown for solder connection to connection tabs 1,440. Also, connection pads 1,442B are shown in hidden lines (dashed lines) for solder connection to connection tabs 1,442 (shown in FIG. 14).

In an exemplary embodiment of the invention connection tabs 1,410A, 1,420A, 1,430A make electrical connection by soldering to electrical connection pads 1,410B, 1,420B, 1,430B, respectively, in order to connect a center tapped secondary coil in small multilayer PC board 1,402 to other traces (not shown) in large multilayer PC board 1,404.

Further, connection tabs 1,440 and 1,442 make electrical connections to the ends of an untapped primary coil (not shown in FIG. 15) in small multilayer PC board 1,402. Soldering tab 1,440 to connection pad 1,440B connects a first end of the primary coil to further conducting traces (not shown in FIG. 15) in large PC board 1,404. Also, soldering tab 1,442 to connection pad 1,442B connects a second end of the primary coil to further conducting traces (not shown in FIG. 15) in large PC board 1,404.

As will be understood, small multilayer PC board 1,402 contains an entire transformer. Ferromagnetic core 1,406A 1,406B completes the magnetic circuit for the transformer contained in small multilayer PC board 1,402.

A transformer contained in small multilayer PC board 1,402 may have any electrical configuration, as illustrated in FIG. 7. The secondary may be a simple coil, and the primary may be a simple coil, neither with a center tap, and in this case both the primary and the secondary are brought out to two electrical contacts such as connection tabs 1,440 1,442. Alternatively, the secondary may have a center tap, and in this case the two ends and the center tap are brought out to three electrical contacts such as contact tabs 1,410A, 1,420A, 1,430A. Further, the primary may be center tapped, and the three connections brought out to three electrical contacts such as contact tabs 1,410A, 1,420A, 1,430A. Still further, both the primary and the secondary may be center tapped, and so both may be brought out to three electrical contacts such as contact tabs 1,410A, 1,420A, 1,430A.

In any event, the formation of semicircular surfaces such as surfaces 1,220, and plating these semicircular surfaces, such as electrical contact tabs 1,410A, 1,420A, 1,430A, and 1,440, 1,442, with a conducting material such as copper facilitates the surface mounting of the small multilayer PC board 1,402 to the large PC board 1,404. The plated semicircular surfaces 1,220 readily accept solder and form a firm bond with connection pads, such as connection pads 1,410B, 1,420B, 1,430B, 1,440B, 1,442B, etc., in the large multilayer PC board 1,404.

The semicircular surfaces of electrical contact tabs 1,410A, 1,420A, 1,430A, 1,440, 1,442, etc. form semi-cylindrical concave surfaces when the tabs are cut along a diameter of a drill hole, as illustrated in FIG. 11, FIG. 12A, and FIG. 12B. Other cross sectional shapes are also useful as electrical contacts. For example, the tabs could be simply cut off square. Alternatively, the tabs could be cut with a convex shape, etc. All such shapes, when electroplated with copper, or when covered by an other electrically conducting material, serve to make good electrical and mechanical soldered bonds to connection pads on a mother board such as multilayer printed circuit board 1,404.

Ferromagnetic core 1,406B is shown as dashed lines to indicate hidden lines. Hole 1,602 in small PC board 1,402 accepts center arm 1,604A and 1,604B of ferromagnetic core 1,406A and 1,406B.

In FIG. 15 and FIG. 16, slot 1,615 is formed in board 1,404. Arm 1,620A and arm 1,620B fit through slot 1,615. Also, slot 1,616 is formed in board 1,404. Arm 1,622A and arm 1,622B fit through slot 1,616.

It is to be understood that the above described embodiments are simply illustrative of the principles of the invention. Various other modifications and changes may be made by those skilled in the art which embody the principles of the invention and fall within the spirit and scope thereof.

What is claimed is:

1. A transformer, comprising:
    a first winding made from a first conducting trace formed on a first multilayer printed circuit board;
    a second winding made from a second conducting trace formed on a second multilayer printed circuit board, said winding magnetically coupled to said second winding;
    a plurality of connection pads on said second multilayer printed circuit board;
    a first connection tab connected to a first end of said first winding; and
    a second connection tab connected to a second end of said first winding, said first connection tab and said second connection tab arranged for soldering to a corresponding connection pad of said plurality of connection pads on said second multilayer printed circuit board, said soldering attaching said first multilayer printed circuit board to said second multilayer printed circuit board.

2. The apparatus as in claim 1, further comprising:
    a ferromagnetic core having "E" shape geometry to form a low reluctance magnetic path coupling said primary winding with said secondary winding, a central arm of said "E" shaped ferromagnetic core passing through a hole in said first multilayer printed circuit board and said second multilayer printed circuit board to pass through a center of said primary winding and said secondary winding.

3. The apparatus as in claim 1, further comprising:
    said first multilayer printed circuit board is attached to said second multilayer printed circuit board.

4. The apparatus as in claim 1, further comprising:
    said first multilayer printed circuit board and said second multilayer printed circuit board are packaged together as a single multilayer printed circuit board.

5. The apparatus as in claim 1, further comprising:
    said first winding is a primary winding, said first winding is made from a first spiral conducting trace in a first layer of said first multilayer printed circuit board, and a second spiral trace in a second layer of said first multilayer printed circuit board, and an electrically conducting via electrically connecting said first spiral conducting trace to said second spiral conducting trace.

6. The apparatus as in claim 1, further comprising:
    said second winding is a secondary winding, said second winding is made from a first spiral conducting trace in a first layer of said second multilayer printed circuit board, and a second spiral conducting trace in a second layer of said second multilayer printed circuit board, and an electrically conducting via electrically connecting said first spiral conducting trace to said second spiral conducting trace.

7. A transformer, comprising:
    a primary winding made from a plurality of first spiral conducting traces formed in a first multilayer printed circuit board;
    a secondary winding made from a plurality of second spiral conducting traces formed in a second multilayer printed circuit board, said primary winding magnetically coupled to said secondary winding, and said second multilayer printed circuit board is a mother board holding a plurality of electronic components, said first and second multilayer printed circuit boards are different sizes;
    a plurality of connection pads on said second multilayer printed circuit board;
    a first connection tab connected to a first end of said primary winding; and
    a second connection tab connected to a second end of said primary winding, said first connection tab and said second connection tab arranged for soldering to a corresponding connection pad of said plurality of connection pads on said second multilayer printed circuit board, said soldering attaching said first multilayer printed circuit board to said second multilayer printed circuit board.

8. The apparatus as in claim 7, further comprising:
    said first multilayer printed circuit board and said second multilayer printed circuit board bonded together as a single multilayer printed circuit board.

9. The apparatus as in claim 7, further comprising:
    said first multilayer printed circuit board is attached to said second printed circuit board.

10. The apparatus as in claim 7, further comprising:
    at least one first electrical conducting via to electrically connect a first spiral conducting trace in a first layer of said first multilayer printed circuit board to a second spiral conducting trace in a second layer of said first multilayer printed circuit board, said first spiral conducting trace and said second spiral conducting trace each selected from said plurality of first spiral conducting traces.

11. The apparatus as in claim 7, further comprising:
    at least one first electrical conducting via to electrically connect a first spiral conducting trace in a first layer of said second multilayer printed circuit board to a second spiral conducting trace in a second layer of said second multilayer printed circuit board, said first spiral conducting trace and said second spiral conducting trace each selected from said plurality of second spiral conducting traces.

12. The apparatus as in claim 1, further comprising:
    said second multilayer printed circuit board being larger than said first multilayer printed circuit board.

13. The apparatus as in claim 7, further comprising:
    said second multilayer printed circuit board being larger than said first multilayer printed circuit board.

14. A transformer, comprising: a primary winding made from a first conducting trace formed on a first multilayer printed circuit board, said primary winding is made from a first multiturn spiral conducting trace in a first layer of said first multilayer printed circuit board, and a second spiral trace in a second layer of said first multilayer printed circuit board, and an electrically conducting via electrically connecting said first spiral conducting trace to said second spiral conducting trace;
    a secondary winding made from a second multiturn conducting trace formed on a second multilayer printed circuit board, said primary winding magnetically coupled to said secondary winding, said secondary winding made from a first spiral conducting trace in a first layer of said second multilayer printed circuit board, and a second spiral trace in a second layer of said second multilayer printed circuit board, and an electrically conducting via electrically connecting said first spiral conducting trace to said second spiral conducting trace, said first and second multilayer printed circuit boards being different sizes;

a plurality of connection pads on said second multilayer printed circuit board;

a first connection tab connected to a first end of said primary winding; and a second connection tab connected to a second end of said primary winding, said first connection tab and said second connection tab arranged for soldering to a corresponding connection pad of said plurality of connection pads on said second multilayer printed circuit board, said soldering attaching said first multilayer printed circuit board to said second multilayer printed circuit board.

15. The apparatus as in claim 14, further comprising:
said second multilayer printed circuit board being larger than said first multilayer printed circuit board.

16. A method of making a transformer, comprising:
forming a first winding from a first multiturn conducting trace on a first multilayer printed circuit board;

forming a second winding made from a second multiturn conducting trace on a second multilayer printed circuit board, said primary winding magnetically coupled to said secondary winding;

forming a plurality of connection pads on said second multilayer printed circuit board;

connecting a first connection tab to a first end of said first winding; and connecting a second connection tab to a second end of said first winding, said first connection tab and said second connection tab arranged for soldering to a corresponding connection pad of said plurality of connection pads on said second multilayer printed circuit board, said soldering attaching said first multilayer printed circuit board to said second multilayer printed circuit board.

17. The method of claim 16, further comprising:
forming a low reluctance magnetic path coupling said primary winding with said secondary winding by a ferromagnetic core having "E" shape geometry, a central arm of said "E" shaped ferromagnetic core passing through a hole in said first multilayer printed circuit board and said second multilayer printed circuit board to pass through a center of said primary winding and said secondary winding.

18. The method of claim 16, further comprising:
using a mother board holding a plurality of electronic components as said second multilayer printed circuit board.

19. The method of claim 16, further comprising:
packaging said first multilayer printed circuit board and said second multilayer printed circuit board together as a single multilayer printed circuit board.

20. The method of claim 16, further comprising:
making a first spiral conducting trace in a first layer of said first multilayer printed circuit board;

making a second spiral conducting trace in a second layer of said first multilayer printed circuit board; and electrically connecting by an electrically conducting via said first spiral conducting trace to said second spiral conducting trace, to make said first winding.

21. The method of claim 16, further comprising:
making a first spiral conducting trace in a first layer of said second multilayer printed circuit board;

making a second spiral conducting trace in a second layer of said second multilayer printed circuit board; and electrically connecting by an electrically conducting via said first spiral conducting trace to said second spiral conducting trace, to make said second winding.

22. The method as in claim 16, further comprising:
fabricating said second multilayer printed circuit board so it is larger than said first multilayer printed circuit board.

23. A transformer, comprising:
a multilayer printed circuit board;

a primary winding made from a first conducting multiturn spiral trace formed on at least one first printed circuit board of said multilayer printed circuit board;

a secondary winding made from at least one second conducting multiturn spiral trace formed on a second printed circuit board of said multilayer printed circuit board, said primary winding magnetically coupled to said secondary winding;

a selected winding of said primary winding and said secondary winding having a first end and a second end;

a first principal connection tab connected to said first end of said selected winding, said first principal connection tab located parallel with a plurality of other connection tabs located in different layers of said multilayer printed circuit board, said first connection tab and said plurality of parallel connection tabs located in different layers of said multilayer printed circuit board having a semicircular shape to form a concave semi-cylindrical shape;

electrically conducting material deposited on said concave semi-cylindrical shape to form an electrical contact to each of said first connection tab and said plurality of connection tabs located in different layers of said multilayer printed circuit board; and a plurality of additional principal connection tabs connected to selected locations in said selected winding, each connection tab of said plurality of principal connection tabs located parallel to a plurality of other connection tabs, each connection tab with its parallel connection tabs having a semi-cylindrical shape coated with conductive material to form an electrical contact for said selected location of said selected winding.

24. The apparatus as in claim 23, further comprising:
said electrical conducting material is copper electroplated to said semi-cylindrical shape formed by said connection tabs.

25. The apparatus as in claim 23, further comprising:
a printed circuit mother board, said mother board having a plurality of connection pads arranged for one said pad to contact one of said semi-cylindrical shapes formed by connection tabs of said multilayer printed circuit board, said connection pad and said semi-cylindrical shape of connection tabs joined electrically and mechanically by solder.

26. A transformer, comprising:
a multilayer printed circuit board;

a primary winding made from a first conducting multiturn spiral trace formed on at least one first printed circuit board of said multilayer printed circuit board, said primary winding having a first end and a second end;

a secondary winding made from at least one second conducting multiturn spiral trace formed on a second printed circuit board of said multilayer printed circuit board, said primary winding magnetically coupled to said secondary winding;

a first principal connection tab connected to said first end of a selected winding of said primary and said secondary windings, said first principal connection tab located parallel with a plurality of other connection tabs located in different layers of said multilayer printed circuit board, said first connection tab and said plurality of parallel connection tabs located in different layers of said multilayer printed circuit board having a semicircular shape to form a concave semi-cylindrical shape;

electrically conducting material deposited on said concave semi-cylindrical shape to form an electrical contact to each of said first connection tab and said plurality of connection tabs located in different layers of said multilayer printed circuit board; and a plurality of additional principal connection tabs connected to selected locations in said selected winding, each connection tab of said plurality of principal connection tabs located parallel to a plurality of other connection tabs, each connection tab with its parallel connection tabs having a semi-cylindrical shape coated with conductive material to form an electrical contact for said selected location of said selected winding.

27. The apparatus as in claim 26, further comprising:

a printed circuit mother board, said mother board having a plurality of connection pads arranged for one said pad to contact one of said semi-cylindrical shapes formed by connection tabs of said multilayer printed circuit board, said connection pad and said semi-cylindrical shape of connection tabs joined electrically and mechanically by solder.

28. A transformer, comprising:

a primary winding made from a first conducting trace formed on a first multilayer printed circuit board;

a secondary winding made from a second conducting trace formed on a second multilayer printed circuit board, said primary winding magnetically coupled to said secondary winding, and said second multilayer printed circuit board is a mother board holding a plurality of electronic components and second multilayer printed circuit board contains at least one slot adapted to receive a portion of a ferromagnetic core used to form a low reluctance magnetic path coupling said primary and secondary windings;

a plurality of connection pads on said second multilayer printed circuit board;

a first connection tab connected to a first end of said primary winding; and a second connection tab connected to a second end of said primary winding, said first connection tab and said second connection tab arranged for soldering to a corresponding connection pad of said plurality of connection pads on said second multilayer printed circuit board, said soldering attaching said first multilayer printed circuit board to said second multilayer printed circuit board.

29. A transformer, comprising:

a multilayer printed circuit board;

a primary winding made from a first conducting multiturn spiral trace formed on at least one first printed circuit board of said multilayer printed circuit board;

a secondary winding made from at least one second conducting multiturn spiral trace formed on a second printed circuit board of said multilayer printed circuit board, said primary winding magnetically coupled to said secondary winding;

a selected winding of said primary winding and said secondary winding having a first end and a second end; and a first principal connection tab connected to said first end of said selected winding, said first principal connection tab located parallel with a plurality of other connection tabs located in different layers of said multilayer printed circuit board, said first connection tab and said plurality of parallel connection tabs located in different layers of said multilayer printed circuit board having a semicircular shape to form a concave semi-cylindrical shape.

30. The apparatus as in claim 29, further comprising:

electrically conducting material deposited on said concave semi-cylindrical shape to form an electrical contact to each of said first connection tab and said plurality of connection tabs located in different layers of said multilayer primed circuit board.

* * * * *